United States Patent
Vetter (10) Patent No.: US 8,492,008 B2
(45) Date of Patent: Jul. 23, 2013

(54) CUTTING TOOL AND ALSO A METHOD FOR THE MANUFACTURE OF A CUTTING TOOL

(75) Inventor: Jorg Vetter, Bergisch-Gladbach (DE)

(73) Assignee: Sulzer Metaplas GmbH, Bergisch Gladbach (DE)

( * ) Notice: Subject to any disclaimer, the term of this patent is extended or adjusted under 35 U.S.C. 154(b) by 105 days.

(21) Appl. No.: 12/209,306

(22) Filed: Sep. 12, 2008

(65) Prior Publication Data

US 2009/0120241 A1    May 14, 2009

(30) Foreign Application Priority Data

Sep. 14, 2007    (EP) .................................... 07116446

(51) Int. Cl.
*B32B 9/00*    (2006.01)

(52) U.S. Cl.
USPC .......... 428/697; 51/307; 51/309; 204/192.12; 204/192.15; 204/192.16; 428/336; 428/698; 428/699; 428/701; 428/702

(58) Field of Classification Search
USPC .................... 51/307, 309; 428/336, 697, 698, 428/699, 701, 702; 204/192.12, 192.15, 192.16
See application file for complete search history.

(56) References Cited

U.S. PATENT DOCUMENTS

| | | | |
|---|---|---|---|
| 4,749,629 A * | 6/1988 | Sarin et al. ..................... 428/701 |
| 5,208,102 A * | 5/1993 | Schulz et al. .................. 428/336 |
| 6,586,122 B2 * | 7/2003 | Ishikawa et al. .............. 428/698 |
| 6,767,627 B2 * | 7/2004 | Morikawa et al. ............ 428/702 |
| 6,794,064 B2 * | 9/2004 | Vetter ............................ 428/699 |
| 7,226,670 B2 | 6/2007 | Derflinger et al. |
| 7,799,415 B2 * | 9/2010 | Moriguchi et al. ............ 428/698 |
| 7,939,181 B2 * | 5/2011 | Ramm et al. ................... 428/701 |
| 8,043,728 B2 * | 10/2011 | Yamamoto .................... 428/697 |
| 8,129,040 B2 * | 3/2012 | Quinto et al. ................. 428/697 |
| 2003/0124391 A1 | 7/2003 | Vetter |
| 2006/0257691 A1 * | 11/2006 | Trinh et al. .................... 428/698 |
| 2008/0131727 A1 | 6/2008 | Derflinger et al. |

FOREIGN PATENT DOCUMENTS

| | | |
|---|---|---|
| CA | 2523882 * | 7/2004 |
| CA | 2601729 A1 | 9/2006 |
| DE | 69425277 T3 | 6/2005 |
| EP | 0739697 B2 | 9/2004 |
| EP | 1764174 A1 | 3/2007 |
| JP | 2002-307129 * | 10/2002 |

(Continued)

OTHER PUBLICATIONS

European Search Report for Patent Application 07116446.1, Feb. 25, 2008.

*Primary Examiner* — Archene Turner
(74) *Attorney, Agent, or Firm* — Robert S. Green (57) ABSTRACT

The invention relates to a cutting tool for the machining of wood or a wood-based material, in particular a wood composite material, or a plastic, wherein a layer system for the formation of a surface coating is present on a surface of a cutting edge of the cutting tool. An outermost surface layer of the layer system is formed from a composition of the form $[Cr_{1-x}O_x]_zX_aC_bN_c$ with $0.05<x<0.75$ and $0<z\leq1$, $0\leq a<1$, $0\leq b<1$, $0\leq c<1$ and $z+a+b+c=1$ and X being an element from the group of the chemical elements consisting of Si, B, Al, Mn, Fe, Co, Ni, Cu, Sc, Y, La, Th, the elements of the group of the lanthanides and the elements of the group IIa of the periodic system of the elements. The invention further relates to a method for the manufacture of a workpiece.

18 Claims, 4 Drawing Sheets

FOREIGN PATENT DOCUMENTS

| | | | |
|---|---|---|---|
| JP | 2004-074361 | * | 3/2004 |
| WO | 2004/059030 A2 | | 7/2004 |
| WO | 2006/084404 A1 | | 8/2006 |
| WO | 2006/099754 A1 | | 9/2006 |

* cited by examiner

CUTTING TOOL AND ALSO A METHOD FOR THE MANUFACTURE OF A CUTTING TOOL

CROSS-REFERENCE TO RELATED APPLICATIONS

The present application claims priority under 35 U.S.C. §119 of European Patent Application No. 07116446.1 filed on Sep. 14, 2007, the disclosure of which is expressly incorporated by reference herein in its entirety.

STATEMENT REGARDING FEDERALLY SPONSORED RESEARCH OR DEVELOPMENT

Not applicable.

REFERENCE TO A COMPACT DISK APPENDIX

Not applicable

BACKGROUND OF THE INVENTION

The invention relates to a cutting tool for the machining of wood or a wood-based material, in particular a wood composite material, or a plastic, and also to a method for the manufacture of a cutting tool in accordance with the pre-characterising part of the independent claim in the respective category.

The manufacture of efficient tools and components is mostly realised by a coating of their surfaces. An important class of such coated substrates are tools, among others in particular chip forming cutting tools, and above all cutting tools in the field of the machining of wood or the machining of plastics. In this connection rotating cutting tools or rotary cutting tools for the machining of wood or wood-based composite material or of plastics are of particular interest, since these often rotate at very high rotary speeds in the operating state and for this reason are exposed to very high mechanical and thermal stresses, in particular in the region of the cutting edges. Typical substrate materials of tools which are coated, are among other things tool steels and hard metals, but also all other possible substrate materials.

Since the use of wood and plastics as materials has increased more and more in recent years and wood, or wood-based materials and plastics are becoming more and more attractive in the market place, the demand for tools for the reliable machining of the materials wood and plastic has risen correspondingly. In this connection, within the scope of this invention, plastics are to be understood to be all usual plastics, known to the person averagely skilled in the art, such as plastic, synthetic composite materials, elastomers, rubber, in particular hard rubber combination materials made of wood and plastics etc.

This applies to a special degree, but not only, to the lamination industry where for example materials with a relatively small diameter and short length are laminated in order to manufacture larger planks or boards or for the further processing of certain materials of larger diameter. Due to ever growing demands on quality, however also for reasons of reliability and economy in the use of the corresponding tools, there is an increasing demand for tools of which the highly loaded cutting edges are appropriately refined on the surfaces which come into direct contact with the material to be processed, wood or plastic.

Such tools are dovetail cutters for example, a tool which is used in the manufacture of laminate boards to produce a dovetail-like joint which, it goes without saying, has to be incorporated into every board as identically as possible, which makes the highest demands on the precision of the tool.

Comparable demands are made on saws provided with tips for example, with which solid blocks, beams or boards have to be sawed for example, however also drills, milling cutters, shape cutters and numerous other tools for plastic and wood machining are further prominent examples.

The service life of the tool also naturally plays an important role, i.e. the time which a tool such as this can be used, until either a cutting edge of the tool has to be reground for example or the cutting edge or the tool as a whole has to be exchanged for a not used tool.

The thickness of the saw blades for example should also be kept to the minimum, so that, on the one hand, as little plastic or wood in the form of sawdust as possible is consumed during sawing and, on the other hand, a high precision is achievable in the machining, e.g in order to produce ever smaller structures. In this connection a situation has to be prevented at the same time in which the tool enters instable operating conditions due to lack of thickness, so that for example in the case of a sawing tool a predetermined machining path can no longer be adhered to, or the tool breaks or cracks due to high stresses.

A further important point relates to the appearance and workmanship of the surface of such cutting tools. It is known that when machining plastics, wood or wood-based materials, deposits of plastic particles, resin-containing or resin-like deposits, or deposits which contain rubber, adhesives, rubber solutions, preservatives of all kinds or other organic or inorganic components of the plastic or wood material or wood composite material to be machined can occur on the surfaces of the cutting tools. If, for example, a plastic or a wood material or a wood composite material is cut, the aforementioned components of the material, which are scattered during cutting, can deposit on the cutting tool. In particular in the region of the cutting edge, the deposited components can solidify and increasingly further deposit. This phenomenon is called the deposition of "gum" in technical terminology, with "gum" not only meaning rubber-like deposits but all deposits which have already been named in part in the above by way of example, which can occur in the machining of plastics and wood materials with cutting tools.

As a rule these deposits of gum are independent of the sharpness of the blade and occur even when the blade is still new and unused. In this connection the deposits are not only present in a deposited and accumulated state, but also in a densely solidified state, which presumably develops by hardening due to polymerisation processes or other, also thermally caused processes of certain components of the plastic or of the wood material. In this connection the deposits are often so tenacious that they can hardly be removed using mechanical or other means, so that the cutting tool becomes unusable due to the deposits and has to be exchanged, although the cutting edge per se is still sufficiently sharp.

In certain cases it is possible in this connection to detach the deposits by means of different solvents, which is naturally time-consuming and correspondingly expensive.

This and further problems, for example in relation to a too great roughness of the surface which, on the one hand, further favours the deposits and, on the other hand, leads to an undesired high friction during the cutting process between the cutting tool and a material which is to be machined, have been known for a long time and have already been discussed in part for the case of wood composite materials in DE 694 25 277 T3 for example, the content of which is hereby incorporated into the present application in its entirety.

With relation to the surface appearance and workmanship of the cutting tools, DE 694 25 277 T3 proposes providing an outermost surface of the flank of a side cutting edge with a coating, which is formed from chromium or a chromium compound with a nitride, a carbide, a carbon nitride or a carbo-nitride.

This means that the authors of DE 694 25 277 T3 propose the application of a pure chromium coating as the outermost coating on a cutting edge of a cutting tool either by means of hard chroming, or depositing CrN, or a compound containing chromium and carbon or a compound containing chromium, carbon and nitrogen, by means of a physical vapour deposition method (PVD) wherein, in relation to chromium compounds, only the characteristics of the surfaces were actually discussed, which either comprise pure chromium or CrN.

These layers discussed in DE 694 25 277 may possibly offer a certain improvement relative to the rest of the prior art. However in practice three decisive disadvantages have emerged.

First of all these layers can not prevent the deposition of the gum defined more closely above to an adequate extent in all cases. A second fundamental disadvantage is that the methods for the generation of the surfaces on the tools proposed in DE 694 25 277 T3 are partly problematic from the point of view of the environment. Thus hard chroming is, as is known, an electrochemical process with questionable effects on the working environment and correspondingly problematic waste products. Thirdly, these tools are only suitable for the machining of wood-based products and not suitable for the machining of plastics.

Furthermore, some completely different methods such as hard chroming and PVD, have to be combined for the generation of the combination layers described in DE 694 25 277 T3, which makes the coating methods time-consuming and expensive.

BRIEF SUMMARY OF THE INVENTION

It is therefore the object of the invention to make available an improved cutting tool for the machining of wood or a wood-based material, and also of plastics, which is particularly simple and economical to manufacture and which at least in the region of the surfaces of the cutting edges is developed in such a way that in the operating state of the cutting tool the deposits known from the prior art can be largely avoided, wherein at the same time an adequate hardness, abrasion resistance and bond strength of the surface is guaranteed and which, as mentioned, in addition to the machining of wood materials, is also suitable for the machining of plastics.

A further object of the invention is to make available a method for the manufacture of a corresponding cutting tool.

The subjects of the invention satisfying these objects are characterised by the features of the independent claims.

The respective dependent claims relate to particularly advantageous embodiments of the invention.

The invention thus relates to a cutting tool for the machining of wood or a wood-based material, in particular a wood composite material, or a plastic, wherein a layer system (4) for the formation of a surface coating is present on a surface (2) of a cutting edge (3) of the cutting tool, characterised in that an outermost surface layer (41, 4100, 4101) of the layer system (4) is formed from a composition of the form $[Cr_{1-x}O_x]_z X_a C_b N_c$ with $0.05<x<0.75$ and $0<z\leq 1$, $0\leq a<1$, $0\leq b<1$, $0\leq c<1$ and $z+a+b+c=1$ and X being an element from the group of the chemical elements consisting of Si, B, Al, Mn, Fe, Co, Ni, Cu, Sc, Y, La, Th, the elements of the group of the lanthanides and the elements of the group IIa of the periodic system of the elements.

Merely for the purpose of clarification it is mentioned once again here that the lanthanide group contains the chemical elements Ce, Pr, Nd, Pm, Sm, Eu, Gd, Tb, Dy, Ho, Er, Tm, Yb, and Lu and the group IIa of the periodic system of the elements comprises the chemical elements Be, Mg, Ca, Sr, Ba and Ra.

It is thus important for the invention that an outermost surface layer, which in accordance with the invention is applied to a cutting edge of the cutting tool, contains at least the elements chromium and oxygen. Surprisingly, it has been namely shown that surface layers of this kind prevent damaging deposits of gum far better than pure chromium layers or chromium nitride layers, which respectively contain no oxygen. It is thus an important recognition of the invention that the additional oxygen in combination with chromium in the layers is responsible for the deposition of gum on the surface of the cutting tools being essentially prevented.

Furthermore, the surface layers of the present invention, even complicated layer systems made of different part layers, can be applied to the cutting tools in a particularly simple method, namely by means of PVD, and particularly preferably by means of arc vaporisation. In this connection only one vaporisation cathode is necessary which, in a corresponding alloy, mixture or chemical composition, contains Cr or possibly one other component X, in other words one element or a plurality of elements from the group of the chemical elements comprising Si, B, Al, Mn, Fe, Co, Ni, Cu, Sc, Y, La, Th, the elements of the lanthanides and the elements of the group IIa of the periodic system of the elements, while the element oxygen, which is important in addition to chromium, however in special cases also nitrogen and carbon, can be added to the coating process in a coating chamber via corresponding process gases in a manner known per se. The C, O and N can naturally also be part of the vaporisation material of the vaporisation cathode in special cases.

In this connection the chromium oxide group $[Cr_{1-x}O_x]_z$ is a stoiciometric chromium oxide, is especially $CrO_2$ or $CrO_3$, is particularly preferably $Cr_2O_3$, or the chromium oxide group $[Cr_{1-x}O_x]_z$ can also be an under-stoichiometric chromium oxide or a non-stoichiometric chromium oxide, in particular a chromium oxide with a high or low oxygen content.

In an embodiment which is particularly important for practical use the outermost surface coating of the cutting edge of the cutting tool only contains the elements chromium and oxygen, i.e. the outermost surface coating is a $[Cr_{1-x}O_x]_z$ layer. In the most general chemical characterisation of a layer in accordance with the invention a=0, b=0, and c=0 applies.

It shall be understood that in certain cases, in addition to Cr and O, a surface coating in accordance with the invention can also additionally contain nitrogen, or rather N, carbon, and/or X, i.e. one or more of the elements out of the group of the chemical elements consisting of Si, B, Al, Mn, Fe, Co, Ni, Cu, Sc, Y, La, Th, the elements of the lanthanide group and the elements of the group IIa of the periodic system of the elements. In other words only a=0, or only b=0, or only c=0 can apply or both a, and b and c can be different from zero, i.e. in addition to Cr and O, the elements from the group X and also N and C can also be contained at the same time.

The choice of the additional components can depend, among other things on which hardness or bond strength of the surface layer is to be set, or which kind of plastic or wood material is to be machined specifically. Depending on which composition the deposits which are to be prevented have, the resistant effect to deposits can be further optimised by a suitable choice of the additional chemical elements in the layer system and hardness and/or the abrasion resistance and/or the bond strength and/or the friction coefficient of the layers can be adjusted.

In another embodiment the layer additionally includes a CrN part layer and/or a CrN graded part layer and/or a Cr part layer and/or a CrO part layer and/or a CrCO part layer and/or a $[Cr_{1-x}O_x]_zX_aC_bN_c$ layer. In this arrangement the Cr part layer can, for example be provided as a bond layer directly on the surface of the cutting edge In very special cases the layer system can include at least two part layer systems arranged one above the other on the surface of the cutting edge, in particular two identical part layer systems.

In a special embodiment of the present invention the part layer system includes in particular a layer sequence of three part layers following each other, namely a Cr part layer, a CrXNC part layer and a. $[Cr_{1-x}O_x]_zX_aC_bN_c$ layer in such a way that the Cr part layer is respectively the nearest adjacent the surface of the cutting edge and the $[Cr_{1-x}O_x]_zX_aC_bN_c$ part layer is respectively the nearest adjacent the outermost surface layer. For example, the different mentioned part layers can fulfil quite specific functions. Thus the Cr part layer preferably acts as a bond layer for adhesion on the metallic body of the cutting tool or for adhesion on a part layer lying underneath it. The Cr layer as an intermediate layer between other part layers can contribute to the reduction of mechanical stresses in a layer system in accordance with the invention.

The $[Cr_{1-x}O_x]_zX_aC_bN_c$-layers or also the other part layers mentioned here can also be designed in different compositions as graded layers, so that a graded layer such as this between two layers effects a matching of two different layers, in which the graded layer near the first layer has approximately the chemical composition of the first layer and near the second layer it has approximately the chemical composition of the second layer. Thus stresses in a multiple layer system can be reduced particularly well and the bond strength between two different part layers can be drastically improved by adaptation of the different lattice geometries.

A layer thickness of the part layer of a layer system in accordance with the invention can lie between 0.05 µm and 5 µm, in particular between 0.1 µm and 3 µm, especially between 0.2 µm and 2.5 µm, and preferably between 1.5 µm and 2.5 µm, and a total thickness of the layer system can lie between 0.01 µm and 50 µm, or between 0.5 µm and 5 µm, in particular between 1 µm and 4 µm, and preferably at 2 µm or 3 µm. It is possible in this connection that in certain cases a very large number of part layers, up to 1000 and more part layers are provided, which can massively increase the operating life of the tool, but can also improve the mechanical stability of very thin cutting edges for example.

A hardness HV.01 of the part layer preferably lies between 1000HV.01 and 3000HV.01, in particular between 1500HV0.1 and 2500HV0.1, preferably at 2000+/− 300HV0.1 and a residual stress of the part layer lies between 0.1 GPa and 5 GPa, in particular between 0.3 GPa and 3 GPa, preferably between 0.5 GPa and 2 GPa.

A cutting tool in accordance with the invention is especially a saw, a knife, a plane, a chisel, a dovetailer, a log saw, a floorboard saw, a shaped part cutter, a moulding cutter, and is especially a rotating cutting tool or a different rotating or a non rotating cutting tool for the machining of plastic or wood.

The invention further relates to a method for the manufacture of a cutting tool in accordance with the invention, wherein the cutting tool is coated using a PVD method, in particular an arc vaporisation method.

In this connection in principle every method of the aforementioned kind known per se and suitable for the manufacture of a cutting tool in accordance with the invention comes into question, with the coating preferably being accomplished using only one vaporisation cathode.

In a particularly important embodiment for practical use for a method in accordance with the invention, a cutting tool is coated in accordance with the following special method procedure:

Making available a vacuum-coating chamber with an arc vaporisation source and placing a cutting tool (1) on a rotatable substrate holder of the coating chamber. Then production of a high vacuum in the coating chamber and raising the temperature to 400° C. for one hour by means of a radiative heater. In this connection a surface of the cutting tool is subjected to ion cleaning for 30 minutes by means of Ar ions. Subsequently the surface of the cutting tool is bombarded for 2 minutes with Cr ions at a bias voltage of 800V. Then a 100 nm thick Cr part layer as a bond layer is deposited on the surface of the cutting tool by mean of arc vaporisation using a bias voltage of 100V. The introduction of a nitrogen gas and the adjustment of a bias voltage of 60V for the deposition of a CrN part layer on the Cr bond layer by means of arc vaporisation takes place, with a nitrogen partial pressure being raised linearly from 0.1 Pa to 2 Pa during the deposition of the CrN graded part layer, until a layer thickness of the CrN graded part layer of 2 µm is reached. Subsequently oxygen is introduced in a mixing ratio nitrogen to oxygen of 1 to 4 and the deposition of an outermost CrNO surface layer takes place by means of arc vaporisation.

BRIEF DESCRIPTION OF THE DRAWINGS

The invention will be explained in the following in more detail with the help of the drawing, which shows, in schematic illustration.

DETAILED DESCRIPTION OF THE INVENTION

Figure 1:
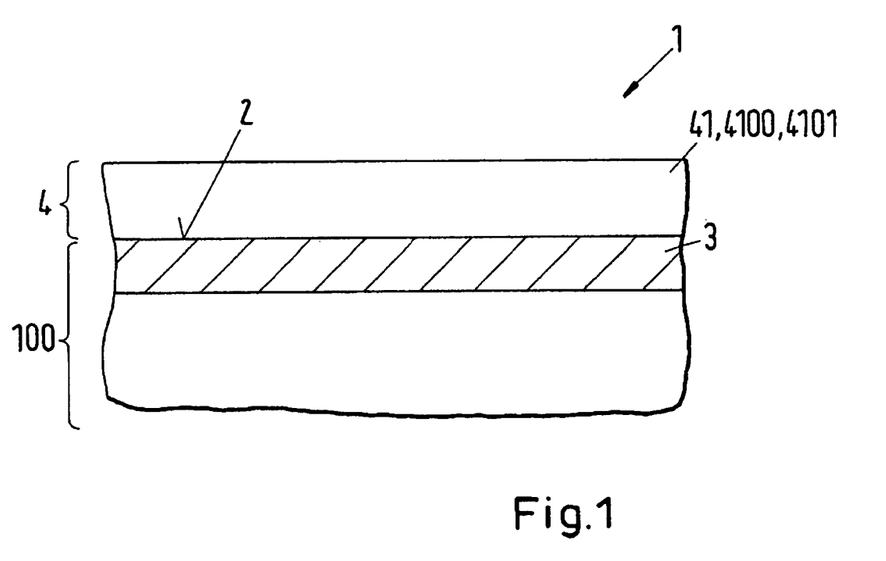
FIG. 1 a first embodiment of a cutting tool in accordance with the invention.

In FIG. 1, in a very simple embodiment, a cutting tool in accordance with, the invention is schematically illustrated which is designated with the reference numeral 1 as a whole in the following. In this arrangement the cutting tool 1 is formed by the coating of a cutting edge 3 of a cutting tool blank 100.

In the example of FIG. 1 a layer system 4 is applied to the illustrated cutting edge 3 of the cutting tool 1, of which only a section is shown, by means of arc vaporisation, which has merely the outermost surface layer 41, 4100, 4101 which, in addition to chromium and oxygen can, in one case, additionally also include one or more elements of the group X and/or can additionally include nitrogen and/or carbon. In this connection a dye can also be introduced into the outermost surface layer 41, 4100, 4101 for example in that an increased oxygen proportion is provided in a manner known per se, or in that another measure for colouring known per se is used.

Figure 2:
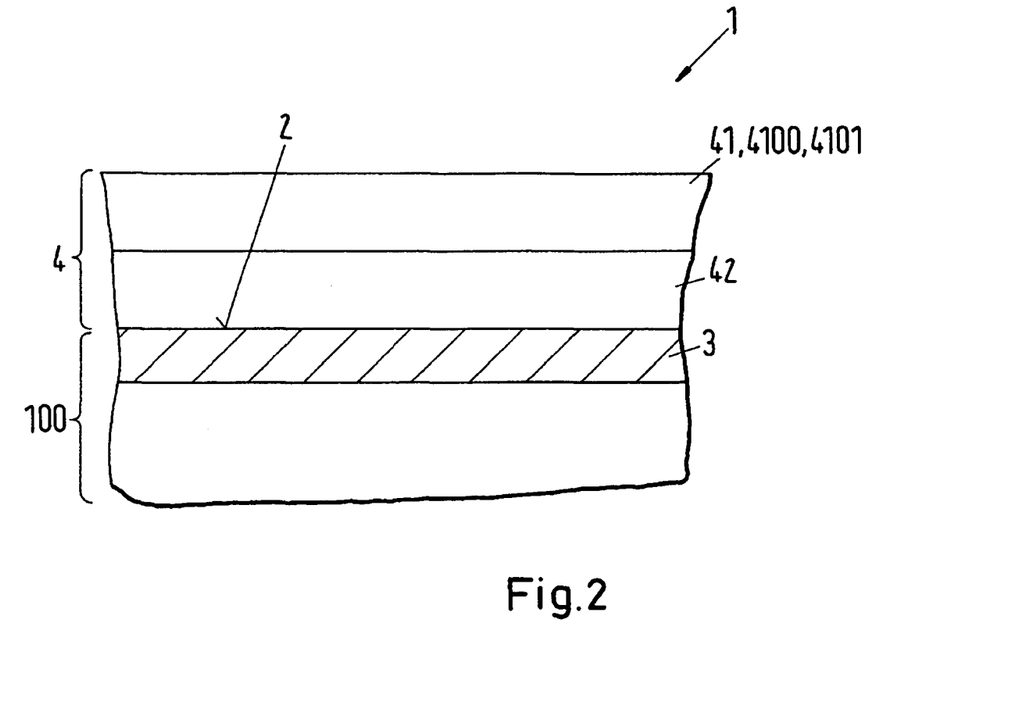
FIG. 2 is a second embodiment of the invention with a CrN part layer.
Figure 3:
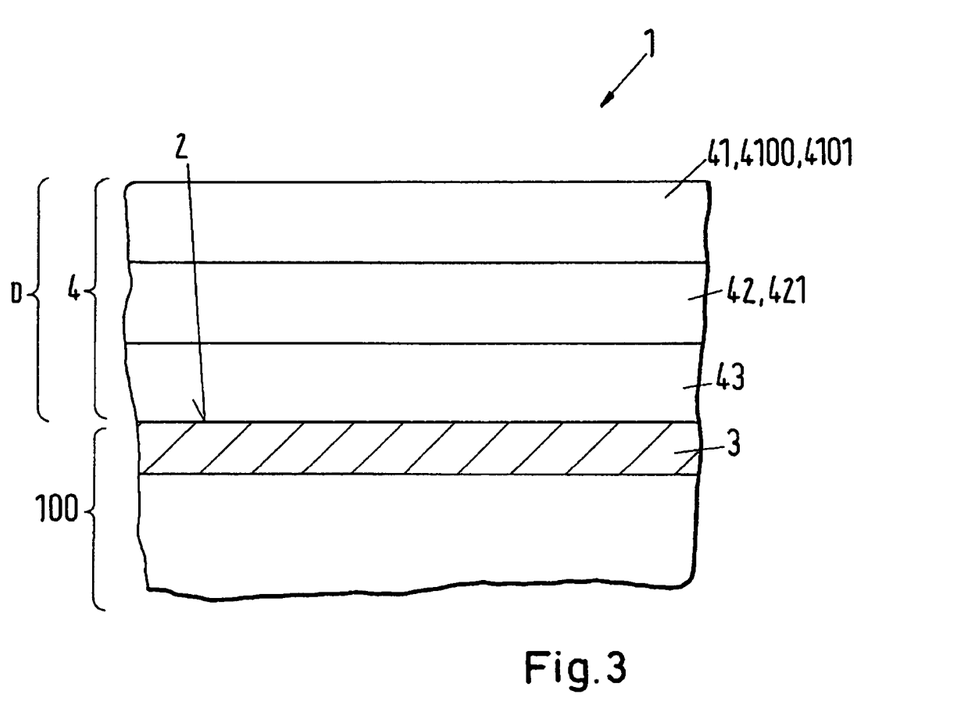
FIG. 3 is a third embodiment of the invention with a Cr bond layer.
Figure 4:
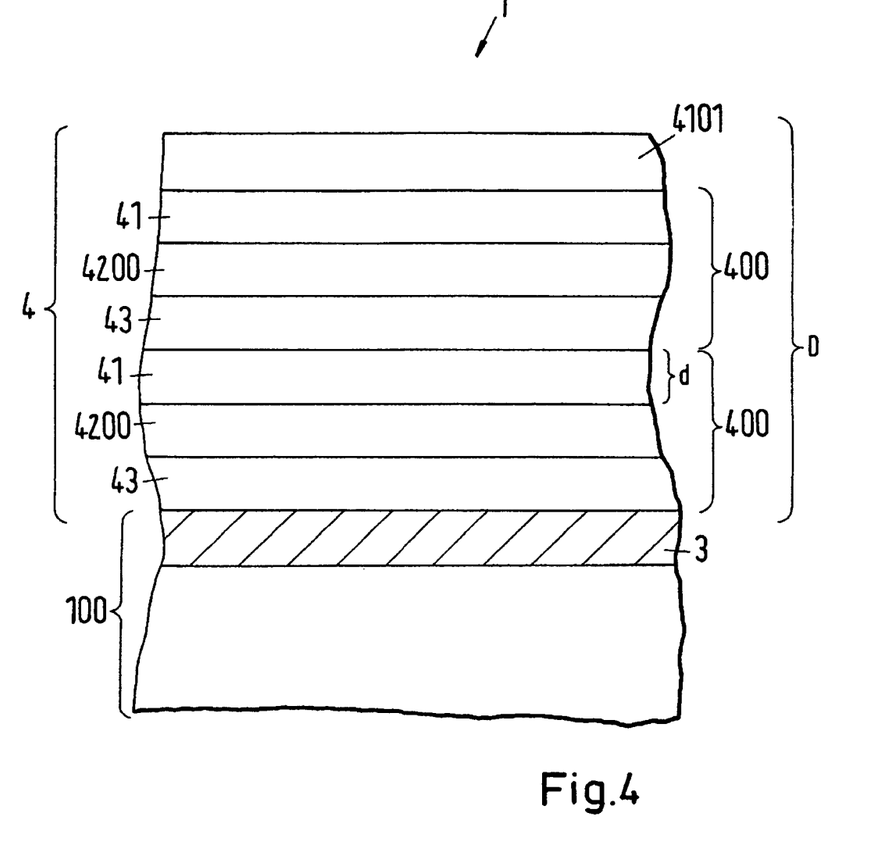
FIG. 4 is an embodiment of the invention with part layer systems.

In the FIGS. 2 to 4 further embodiments which are particularly important for practical use of a cutting tool in accordance with the invention are schematically illustrated by way of example.

The embodiment of FIG. 2 differs from that of FIG. 1 in that between the cutting edge 3 and the outermost surface layer 41, 4100, 4101 another CrN part layer 42 is additionally provided on the surface 2 of the cutting edge 3 of the cutting tool blank 100. This additional CrN layer 42 increases the bond strength of the outermost surface layer 41 for example.

In FIG. 3 a further development of the embodiment in accordance with FIG. 2 is illustrated. In the example of FIG. 3, which is very important for practical use, another pure Cr part layer 43 is provided on the surface, i.e. between the surface 2 of the cutting tool blank 100 and the CrN part layer 42, 421.

The Cr part layer 43 improves the adhesion of the layer system 4 with the total thickness D on the surface 2 of the cutting edge 3 in particular. The CrN part layer 42 is preferably formed as a CrN graded part layer 421, the chemical composition of which is almost pure chromium near the Cr part layer 43 and which has a CrN composition near the outermost surface layer 41, 4100, 4101. As a result of a layer sequence such as this one obtains a layer system 4, which has particularly low inner stress and bonds very well on the surface 2 of the cutting edge 3.

Finally in FIG. 4 a very differentiated layer composition is illustrated as a different embodiment of the present invention.

In this arrangement this is a cutting tool 1 with a layer system 4, wherein two identical part layer systems 400 are provided on the surface 2 of the cutting edge 3, and also a surface layer layer 4101 is provided as an outermost surface layer 41 which has a particularly high oxygen content, so that a colouration of the surface layer 101 is achieved.

The two part layer systems 400 each comprise three individual part layers 43, 4200, 41 of the respective, possibly difference thicknesses d, wherein the part layer 43 is a pure Cr part layer 43 for the improvement of the adhesion, wherein the part layer 4200 is formed as a CrXNC part layer for the reduction of stress and the part layer 41 is a $[Cr_{1-x}O_x]_z X_a C_b N_c$-part layer 41, which guarantees a particularly good adaptation of the coloured, for example slightly blue surface layer layer 4101 to the part layers lying below it.

It will be understood that the above-described embodiments of the invention, can be combined in every suitable manner, depending on the application and in particular the layer sequences illustrated by way of example can also be realised in a different way and one or more of the layers can be left out completely in a special embodiment of a layer system in accordance with the invention or in a different embodiment can also occur repeatedly in one and the same layer system.

What is claimed as new and desired to be protected by Letters Patent of the United States is:

1. A cutting tool for the machining of wood or a wood-based material, a wood composite material, or a plastic, comprising a layer system for the formation of a surface coating is present on a surface of a cutting edge of the cutting tool, wherein an outermost surface layer of the layer system is formed from a composition of the form $[Cr_{1-x}O_x]_z X_a C_b N_c$ with $0.05<x<0.75$ and $0<z\leq 1$, $0<a<1$, $0<b<1$, $0<c<1$ and $z+a+b+c=1$ and X being an element from the group of the chemical elements consisting of Si, B, Mn, Co, Ni, Cu, Sc, Y, Th, the elements of the group of the lanthanides and the elements of the group IIa of the periodic system of the elements.

2. A cutting tool in accordance with claim 1, wherein the chromium oxide group $[Cr_{1-x}O_x]_z$ is a stoiciometric chromium oxide.

3. A cutting tool in accordance with claim 1, wherein at least one of a=0, b=0, and c=0.

4. A cutting tool in accordance with claim 1, wherein the layer system additionally includes at least one of a CrN part layer, a CrN gradient part layer, a Cr part layer, a CrO part layer, a CrCO part layer, and a $[Cr_{1-x}O_x]_z X_a C_b N_c$ part layer, and wherein the additional layer is between the surface of the cutting edge and the outermost surface layer.

5. A cutting tool in accordance with claim 4, wherein the Cr part layer is provided as a bond layer directly on the surface of the cutting edge.

6. A cutting tool in accordance with claim 4, wherein the layer system includes at least two part layer systems arranged one above the other on the surface of the cutting edge.

7. A cutting tool in accordance with claim 6, wherein the part layer system includes a layer sequence of three part layers following each other, a Cr part layer, a CrXNC part layer and a $[Cr_{1-x}O_x]_z X_a C_b N_c$ part layer in such a way that the Cr part layer is respectively the nearest adjacent the surface of the cutting edge and the $[Cr_{1-x}O_x]_z X_a C_b N_c$ part layer is respectively the nearest adjacent the outermost surface layer.

8. A cutting tool in accordance with claim 4, wherein a layer thickness (d) of the part layer lies between 0.05 μm and 5 μm.

9. A cutting tool in accordance with claim 1, wherein a total thickness (D) of the layer system lies between 0.01 μm and 50 μm.

10. A cutting tool in accordance with claim 4, wherein a hardness of the part layer lies between 1000HV.01 and 3000HV.01.

11. A cutting tool in accordance with claim 4, wherein a residual stress of the part layer lies between 0.1GPa and 5GPa.

12. A cutting tool in accordance with claim 1, wherein the cutting tool is one of a saw, a knife, a plane, a chisel, a dovetailer, a shaped part cutter, a moulding cutter, and a rotating cutting tool.

13. A method for the manufacture of a cutting tool (1) in accordance with claim 1, wherein the cutting tool is coated using a PVD method.

14. A method in accordance with claim 13 including the following steps:
   making available a vacuum coating chamber with an arc vaporisation source;
   placing a cutting tool on a rotatable substrate holder of the coating chamber;
   production of a high vacuum in the coating chamber;
   raising the temperature to 400° C. for one hour by means of a radiative heater;
   the ion cleaning of a surface of the cutting tool for 30 minutes by means of Ar ions;
   the bombardment of the surface for 2 minutes by means of Cr ions at a bias voltage of 800V;
   the deposition of a 100 nm thick Cr part layer as a bond layer on the surface of the cutting tool by means of arc vaporisation using a bias voltage of 100V;
   the introduction of a nitrogen gas and the adjustment of a bias voltage of 60V;
   the deposition of a CrN graded part layer on the Cr bond layer by means of arc vaporisation, wherein a nitrogen partial pressure is raised linearly from 0.1 Pa to 2 Pa during the deposition of the CrN gradient part layer, until a layer thickness (d) of the CrN gradient part layer of 2 μm is reached;
   the introduction of oxygen in a mixing ratio nitrogen to oxygen of 1 to 4, and
   the deposition of an outermost CrNO surface layer by means of arc vaporisation.

15. A cutting tool in accordance with claim 1, wherein the chromium oxide group $[Cr_{1-x}O_x]_z$ is one of $CrO_2$ or $CrO_3$.

16. A cutting tool in accordance with claim 1, wherein the chromium oxide group $[Cr_{1-x}O_x]_z$ is one of an under-stoichiometric chromium oxide and a non-stoichiometric chromium oxide.

17. A cutting tool in accordance with claim 4, wherein the layer system includes at least two part layer systems arranged one above the other on the surface of the cutting edge, and wherein the at least two part layer systems are identical part layer systems.

18. A cutting tool for the machining of wood or a wood-based material, a wood composite material, or a plastic, comprising a layer system for the formation of a surface coating is present on a surface of a cutting edge of the cutting tool, wherein an outermost surface layer of the layer system is formed from a composition of the form $[Cr_{1-x}O_x]_z X_a C_b N_c$ with $0.05<x<0.75$ and $0<z\leq1$, $0<a<1$, $0<b<1$, $0<c<1$ and $z+a+b+c=1$ and X being an element from the group of the chemical elements consisting of Si, B, Al, Mn, Co, Ni, Cu, Sc, Y, La, Th, the elements of the group of the lanthanides and the elements of the group IIa of the periodic system of the elements, wherein the outermost surface layer of the layer system protects the cutting tool from work piece build-up when the cutting tool machines wood or a wood-based material, a wood composite material, or a plastic.

\* \* \* \* \*